United States Patent [19]
Ludwig et al.

[11] Patent Number: 4,815,113
[45] Date of Patent: Mar. 21, 1989

[54] METHOD FOR DIGITAL SLOPE CONTROL OF OUTPUT SIGNALS OF POWER AMPLIFIERS IN SEMICONDUCTOR CHIPS

[75] Inventors: Thomas Ludwig, Sindelfingen; Helmut Schettler, Dettenhausen; Otto Wagner, Altdorf; Rainer Zuhlke, Leonberg, all of Fed. Rep. of Germany

[73] Assignee: International Business Machines Corporation, Armonk, N.Y.

[21] Appl. No.: 110,399

[22] Filed: Oct. 20, 1987

[30] Foreign Application Priority Data

Oct. 21, 1986 [EP] European Pat. Off. ........ 86114537.3

[51] Int. Cl.$^4$ ............................................. H03K 5/22
[52] U.S. Cl. ..................... 377/39; 307/263; 307/520; 328/185
[58] Field of Search ............... 377/39, 20; 307/263, 307/517, 520; 328/185, 114

[56] References Cited

U.S. PATENT DOCUMENTS

| | | | |
|---|---|---|---|
| 3,878,370 | 4/1975 | Santomango et al. | 377/39 |
| 3,914,623 | 10/1975 | Clancy | 307/263 |
| 3,924,078 | 12/1975 | Bussey | 377/39 |
| 3,931,610 | 1/1976 | Marin et al. | 377/39 |
| 3,944,858 | 3/1976 | Pettersson | 377/39 |
| 4,373,394 | 2/1983 | Renzel et al. | 328/185 |

Primary Examiner—John S. Heyman
Attorney, Agent, or Firm—Stephen J. Limanek; Mark F. Chadurjian

[57] ABSTRACT

A method for the digital slope control of the output signals of power amplifiers, as well as a power amplifier suitable for carrying out the method as described. One way of representing the actual slope value is via the number of clock pulses applied to a counter during a measuring interval which depends in its duration on the slope. Such a measuring interval is produced by applying the pulses of a ring oscillator containing one of the power amplifiers to another counter until the overflow of the latter. Another mode of representing the actual slope value consists in counting the number of pulses of the ring oscillator during a measuring interval of predetermined duration. Actual and nominal values of the slope are compared. The results of this comparison change the contents of a left/right-shift register. Its parallel outputs influence, via control lines, control inputs of the power amplifiers in order to alter their slope by switching on or off output transistors arranged in parallel with respect to their switching paths.

11 Claims, 2 Drawing Sheets

METHOD FOR DIGITAL SLOPE CONTROL OF OUTPUT SIGNALS OF POWER AMPLIFIERS IN SEMICONDUCTOR CHIPS

TECHNICAL FIELD

This invention relates to a method and a circuit arrangement for digital slope control of output signals of power amplifiers in semiconductor chips with very large scale integration (VLSI) circuits for a computer.

For parallel data transmission with computers, several power amplifiers have to be switched on or off simultaneously. The current change appearing in the supply lines during the switching process produces a noise voltage $u_L$ owing to the inductivity L of these lines, the value of the voltage being determined as $u_L = -L\, di/dt$ following the induction law. The greater the number of power amplifiers switched simultaneously, and the higher their switching speed, i.e., the steeper the slope of their output signals, the higher the undesired noise voltage on the supply lines. Consequently, semiconductor circuits on one and the same semiconductor chip can be disturbed in their proper functioning. Power amplifiers connected to other semiconductor chips and remaining in one switching state transfer the induced noise voltage to these semiconductor chips, which noise voltage can be detected there by the receiver circuits as a data change which leads to faulty functions.

To ensure fault-free operation of a computer it has to be made sure that the above specified noise voltage remains below the switching threshold of the storage elements. In the past this problem was solved by assembling into groups the power amplifiers whose simultaneous switching was desirable but unrealizable owing to the generation of noise voltage, and by switching the groups in a staggered mode. However, this type of operation reduces the speed of data transfer.

DISCLOSURE OF THE INVENTION

It is an object of this invention to ensure simultaneous switching of a respective number of power amplifiers connected to a data bus without the noise voltage caused by such switching reaching an inadmissibly high value. The invention achieves this object in that it provides a method and a circuit arrangement for digitally controlling the slope of the power amplifiers, as well as a power amplifier suitable for carrying out that method.

Apart from the above mentioned acceleration of data transfer by avoiding the staggered switching of power amplifiers assembled in groups, the invention also permits the adaptation of different slopes of such power amplifiers which are provided on different semiconductor chips, and whose different slopes are due to tolerances of the manufacturing process. Furthermore, any effects caused by temperature changes and/or variations of the supply voltage on the slope can be compensated by the invention. Finally, the invention offers reliable test operation while remaining below the admissible value, by selecting a lower slope, which would otherwise increase noise voltage during amplifier switching due to high inductivity of contact probes.

In accordance with the teachings of this invention, a method for the digital slope control of output signals of power amplifiers, as well as a power amplifier suitable for carrying out the method, are described. One way of representing the actual slope value is via the number of clock pulses applied to a counter during a measuring interval which depends in its duration on the slope. Such a measuring interval is produced by applying the pulses of a ring oscillator containing one of the power amplifiers to another counter until the overflow of the latter. Another mode of representing the actual slope value consists in counting the number of pulses of the ring oscillator during a measuring interval of predetermined duration. Actual and nominal values of the slope are compared. The results of this comparison change the contents of a left/right-shift register. Its parallel outputs influence, via a control line, control inputs of the power amplifiers in order to alter their slope by switching on or off output transistors arranged in parallel with respect to their switching paths.

The foregoing and other object, features and advantages of the invention will be apparent from the following more particular description of the preferred embodiments of the invention, as illustrated in the accompanying drawings.

BEST MODE FOR CARRYING OUT THE INVENTION

Figure 1:
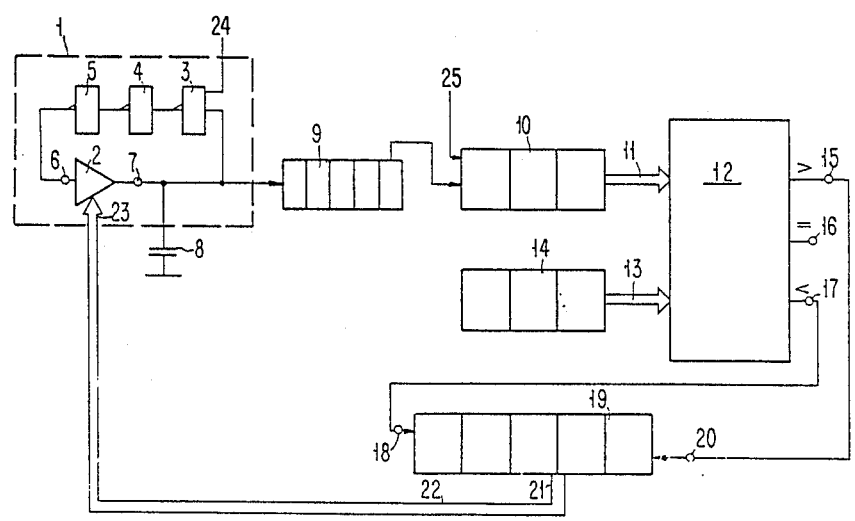
FIG. 1 is a block diagram of a circuit arrangement for carrying out the method as disclosed by this invention.

In the block diagram of FIG. 1, the dashed line surrounds a ring oscillator 1 comprising one 2 of the power amplifiers whose slope is to be controlled, and an odd number of inverter stages 3, 4, and 5 ensuring the oscillation of the ring oscillator 1 by feeding back the output signal of inverter 5 to a data input 6 of the power amplifier 2. Inverter stage realized by a NAND gate to whose second input 24 a control signal is applied which by means o a level change permits the interruption of the ring oscillator loop. An external capacitor 8 is connected to output 7 of the power amplifier 2. Its capacity is selected in accordance with the average load capacity of the power amplifiers to be controlled and co-determines the frequency of the ring oscillator 1. Output 7 of the power amplifier 2 is connected to the input of a first counter 9 counting the pulses of ring oscillator 1. The first counter 9 controls, until its overflow, a second counter 10 to which, until the overflow of the first counter 9, clock pulses are applied as counting pulses via its second input 25. Their number is an indicator for the actual value of the slope of the signal of the power amplifiers to be controlled.

The contents of the second counter 10 are applied to first inputs 11 of a comparator circuit 12 whose second inputs 13 are connected to a register 14 receiving the nominal value of the slope. The nominal value of the slope may be applied to register 14 by a shift operation wherein the register is part of a master-slave latch chain, as in level sensitive scan design (LSSD). In accordance with the three possible comparison results smaller than, greater than, equal to, comparator circuit 12 comprises three outputs 15, 16 and 17. Output 15 is connected to the left-shift input 20 of a left/right-shift register 19, whereas output 17 is connected to the right-shift input 18 of the shift register 19. Parallel outputs 21 of the shift register 19 are connected via lines 22 to control inputs 23 of the power amplifier 2 whose slope is to be controlled.

Figure 2:
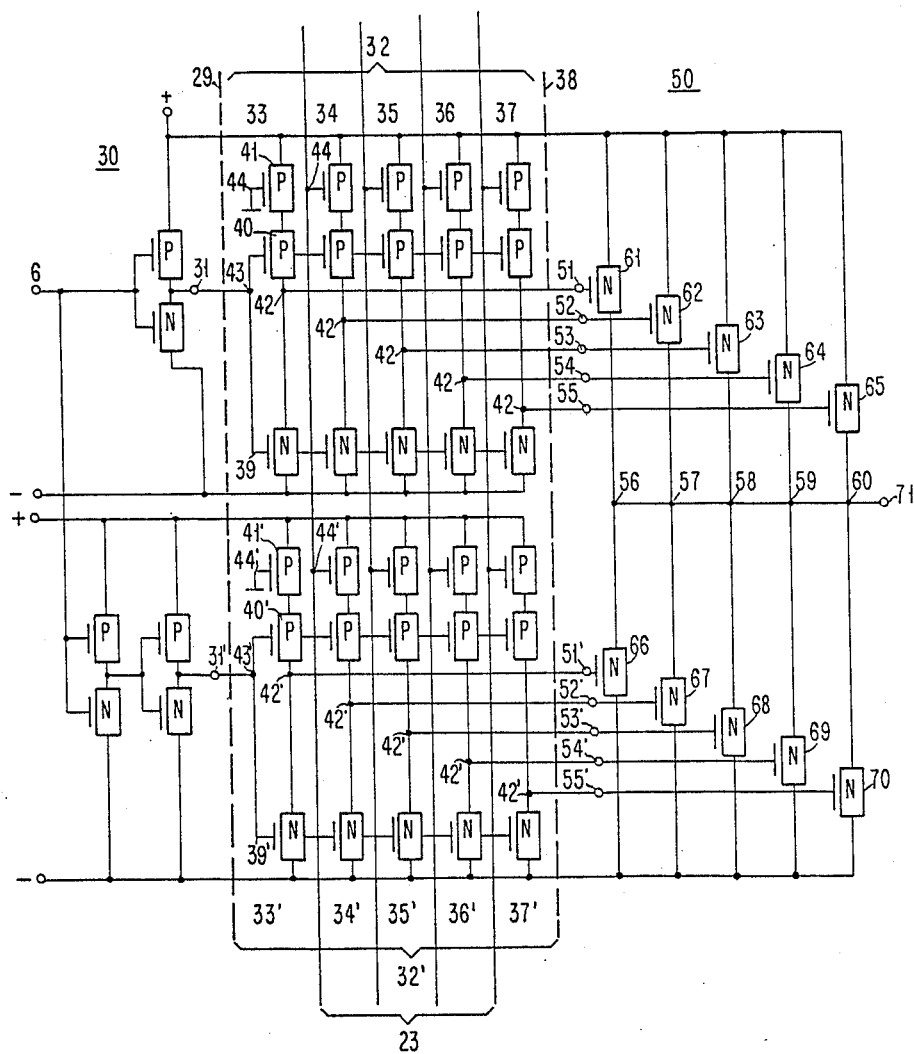
FIG. 2 is a simplified circuit diagram of a power amplifier with controllable output signal slope.

A simplified circuit diagram of one 2 of these power amplifiers, indicated in FIG. 1, with a controllable output signal slope is depicted in FIG. 2. The power amplifier consists of three parts. After an input stage 30 with two complementary outputs 31 and 31' which is separated from a following circuit by a dashed line 29 there is provided a group 32 or 32' of pre-stages 33 to 37 or 33' to 37', respectively, connected to one respectively of these outputs, these stages being separated by a dashed line 38 from a subsequent circuit. Pre-stages 33 to 37 or 33' to 37', respectively, are arranged in parallel with respect to their switching path. Each pre-stage consists of a series arrangement of three transistors 39, 40, 41 and 39', 40', 41', with the first transistor 39 or 39' being of the one conductivity type and the two others, i.e., 40, 41 or 40', 41', being of the other conductivity type. The point of connection of the two transistors of opposite conductivity type represents output 42 or 42' of the pre-stage. Each pre-stage has two inputs 43, 44 or 43', 44'. The first inputs 43 of all pre-stages of the one group 32 are connected to the first output 31 of the input stage 30, those of the other group 32' being connected to the other output 31'. The second inputs of all pre-stages 33 to 37 or 33' to 37' are respectively connected to a parallel output of the left/right-shift register 19 of FIG. 1 of the drawings, with the exception of one pre-stage in each group whose second input is connected to a reference potential to ensure functioning of the circuit. Each of the outputs 42 or 42' of the pre-stages 33 to 37 or 33' to 37' is connected to one of inputs 51 to 55 or 51' to 55' of an output stage 50 described hereinbelow of the power amplifier 2 of FIG. 1. This output stage, operating as a push-pull output stage 50, consists of a group of push-pull amplifiers 56 to 60. Transistors 61 to 65 for generating the rising edge of an output signal as well as transistors 66 to 70 for generating a trailing edge are arranged in parallel with respect to their switching paths. The points of connection of all transistors 61 to 65 for generating the rising edge of the output signal are interconnected with transistors 66 to 70 for generating the trailing edge, and form output 71 of the power amplifier, which corresponds to output 7 in FIG. 1.

In the following, the operation of the circuit arrangement for carrying out the method as disclosed by the invention will be described.

The nominal value of the slope is applied to the nominal value register 14. The actual value is represented by the number of clock pulses which are applied to counter 10 during a measuring interval whose duration depends on the actual value of the slope. The measuring interval is produced in that the pulses of the ring oscillator 1 comprising one of the power amplifiers 2 whose slope is to be controlled are applied to counter 9 until the overflow of the latter. The thus defined interval increases in length with the decreasing of the slope of power amplifier 2 used in the ring oscillator 1, and vice versa. After the overflow of counter 9, the ring oscillator loop is interrupted by means of NAND gate 3. It should be noted that by providing an up level to the upper input of the NAND gate 3, the output of the gate 3 is the inversion of the signal applied to its lower input. By applying a down level signal to the upper input, an up level present at the lower input from power amplifier 2 will not be inverted. Thus, it can be seen that the ring oscillator 1 is interrupted as long as a down level is present at the upper input of the NAND gate 3. Subsequently, the count of counter 10 representing the actual value of the slope is compared in comparator circuit 12 with the value in nominal value register 14. The result of this comparison is applied to the left/right-shift register 19. If the result of the comparison indicates that the actual value of the slope is higher than the nominal value there appears a signal at output 15 of comparator circuit 12 by which the shift register contents which at the beginning of the control process had consisted of a number of the same binary values, e.g., of nothing but One's, is shifted to the left, and a Zero moves in. This means that one of the output lines 22 of shift register 19 which are connected to the control input 23 of power amplifier 2 contains a potential by means of which one of the pre-stages 33 to 37 or 33' to 37' of power amplifier 2 are rendered non-conductive. Therefore, the associated output stage of power amplifier 2 is rendered non-conductive, too. It, thus, carries no current any longer so that the slope of the output signal is reduced. Subsequently, the ring oscillator loop is closed again via NAND gate 3, and the new actual value of the slope is compared again with the nominal value. If the comparison shows that the actual value is smaller than the nominal value, comparator circuit 12 supplies at output 17 a signal through which the former register contents is shifted to the right and a One moves in. Thus, the output line of another shift register stage is given such a potential that one of the pre-stages connected thereto is rendered conductive. As a consequence, the associated output stage is additionally conductive, too, which leads to an increase of the output signal slope.

The steps described above are repeated until the uniformity of nominal and actual value has been reached. The contents of the shift register then remains unchanged.

Apart from the above described manner, the measuring of the actual value of the slope can also be realized in that the duration of the measuring interval is maintained constant and comprises, e.g., several clock pulse cycles. During this time, the number of ring oscillator pulses is counted. The respective count is proportional to the slope of the output voltage of the power amplifier 2 in the ring oscillator. It increases with the slope increase.

If in the course of the operation of the data processing system the operating temperature is changed, or the supply voltage varies, which is expressed in a slope alteration, there is a re-control since co of actual and nominal value is performed continuously.

While the invention has been particularly shown and described with reference to preferred embodiments thereof, it will be understood by those skilled in the the art that various changes in form an details may be made therein without departing from the script and scope of the invention.

What is claimed is:

1. A method for the digital slope control of output signals of power amplifiers of semiconductor chips, characterized by the following process steps:
  representing a slope value of said signals via a number of clock pulses applied to a first counter during a measuring interval whose duration depends on the slope,
  comparing in a comparator circuit the actual value represented by the count of said number of clock pulses with a nominal slope value stored in a nominal value register, and
  applying the result of the comparison to a left/right-shift register whose parallel outputs connected to control inputs of said power amplifiers via which the slope of their output signals can be changed.

2. A method as set forth in claim 1, characterized in that the duration of the measuring interval for representing the actual slope value is inversely proportional thereto.

3. A method as set forth in claim 2, characterized in that the measuring interval is formed by applying the pulses of a ring oscillator comprising one of said power amplifiers to a second counter until overflow of said second counter.

4. A method for the digital slope control of output signals of power amplifiers of semiconductor chips, characterized by the following process steps:
representing the slope value of the output signals via a number of pulses which a ring oscillator comprising one of said power amplifiers applies to a first counter during a measuring interval of predetermined duration,
comparing in a comparator circuit the actual value represented by the count of said number of pulses with a nominal slope value stored in a nominal value register, and
applying the results of the comparison to a left/right-shift register whose parallel outputs are connected to control inputs of said power amplifiers via which control inputs the slopes of their output signals can be changed.

5. A method as set forth in claim 4, characterized in that the predetermined measuring interval represents an integer multiple of a clock interval, and that it is generated by applying clock pulses to a second counter up to a predetermined count.

6. A circuit arrangement comprising:
a power amplifier having an output signal of a given slope value and control inputs,
a counter,
means for representing said given slope value of said output signal via a number of clock pulses applied to said counter during a measuring interval whose duration depends on said slope value,
a comparator circuit,
a first register having a nominal slope value stored therein,
means for comparing in said comparator circuit said number of clock pulses with the nominal slope value stored in said register,
a left/right-shift register having a plurality of parallel outputs,
means for applying the output of said comparator circuit to said left/right-shift register, and
means for coupling said plurality of parallel outputs to said control inputs of said power amplifier to modify the slope value of said output signal of said power amplifier.

7. A circuit arrangement as set forth in claim 6 further including
a ring oscillator having said power amplifier disposed therein, and
a capacitor having a predetermined capacitance value.

8. A circuit arrangement as set forth in claim 6 wherein said power amplifier is a push-pull amplifier and further including
an input stage having two outputs providing complementary binary signals,
a group of pre-stages connected to each one of said outputs, said pre-stages being arranged in parallel with respect to their switching paths and respectively have one output and two inputs of which the second input is respectively connected to one of said parallel outputs of said left/right-shift register, and
push-pull output stage means for producing rising and trailing pulse edge slopes of said output signal including a plurality of transistors arranged in parallel with respect to their switching paths having control electrodes respectively connected to one of the outputs of said pre-stages.

9. A circuit arrangement as set forth in claim 8 wherein each of said pre-stages includes a series arrangement of first, second and third transistors, said first transistor of each of said pre-stages being of one conductivity type and said second and third transistors being of an opposite conductivity type, the common point of connection of said first and second transistors of each of said pre-stages representing an output of said pre-stages, the control electrodes of said first and second transistors being connected to the same output of said input stage and the control electrodes of said third transistors of each of said pre-stages, with the exception of one of said third transistors being connected to a point of reference potential, being respectively connected to one of said parallel outputs of said left/right-shift register.

10. A circuit arrangement as set forth in claim 8 wherein said input stage and said pre-stages include complementary transistors, and the transistors of said push-pull output stage means are of one conductivity type.

11. A circuit arrangement as set forth in claim 8 wherein said transistors are field effect transistors.

* * * * *